(12) United States Patent
Gehrke et al.

(10) Patent No.: US 10,078,267 B2
(45) Date of Patent: Sep. 18, 2018

(54) METHOD FOR PREDICTING AT LEAST ONE ILLUMINATION PARAMETER FOR EVALUATING AN ILLUMINATION SETTING

(71) Applicant: Carl Zeiss SMT GmbH, Oberkochen (DE)

(72) Inventors: Ralf Gehrke, Aalen (DE); Christoph Hennerkes, Milpitas, CA (US); Wolfgang Hoegele, Schwaebisch Gmuend (DE); Joerg Zimmermann, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 15/481,607

(22) Filed: Apr. 7, 2017

(65) Prior Publication Data

US 2017/0212426 A1      Jul. 27, 2017

Related U.S. Application Data

(63) Continuation of application No. PCT/EP2015/075011, filed on Oct. 28, 2015.

(30) Foreign Application Priority Data

Nov. 14, 2014   (DE) .................. 10 2014 223 326

(51) Int. Cl.
  *G03B 27/54*   (2006.01)
  *G03F 7/20*    (2006.01)
(52) U.S. Cl.
  CPC ...... *G03F 7/70125* (2013.01); *G03F 7/70516* (2013.01)

(58) Field of Classification Search
  CPC .................. G03F 7/70133; G03F 7/70625
  (Continued)

(56) References Cited

U.S. PATENT DOCUMENTS 6,658,084 B2   12/2003   Singer
6,859,515 B2    2/2005   Schultz et al.
(Continued)

FOREIGN PATENT DOCUMENTS

DE   10 2005 051 824 A1   5/2007
DE   10 2012 212 664 A1   1/2014
(Continued)

OTHER PUBLICATIONS

German Office Action, with translation thereof, for corresponding DE Appl No. 10 2014 223 326.7, dated Jun. 30, 2015.
(Continued)

*Primary Examiner* — Hung Henry Nguyen
(74) *Attorney, Agent, or Firm* — Fish & Richardson P.C.

(57) ABSTRACT

In a method for predicting at least one illumination parameter for evaluating an illumination setting for illuminating an object field of a projection exposure apparatus, illumination parameters are measured at a number of calibration settings, correction terms for prediction values of the illumination parameters are determined from the measured values, and then at least one illumination parameter of at least one illumination setting, which is not contained in the set of n calibration settings, is predicted.

20 Claims, 4 Drawing Sheets

(58) Field of Classification Search
USPC .................................................... 355/55, 67
See application file for complete search history.

(56) References Cited

U.S. PATENT DOCUMENTS

| | | | |
|---|---|---|---|
| 7,196,841 B2 | 3/2007 | Melzer et al. | |
| 2006/0126046 A1* | 6/2006 | Hansen | G03F 7/70108 355/55 |
| 2008/0013680 A1 | 1/2008 | Singer et al. | |
| 2011/0001947 A1 | 1/2011 | Dinger et al. | |
| 2012/0229786 A1* | 9/2012 | Engelen | G03F 7/70091 355/67 |
| 2015/0153652 A1 | 6/2015 | Zimmermann et al. | |
| 2015/0198891 A1 | 7/2015 | Patra | |

FOREIGN PATENT DOCUMENTS

| | | |
|---|---|---|
| DE | 10 2012 220 596 A1 | 5/2014 |
| EP | 1 225 481 A2 | 7/2002 |

OTHER PUBLICATIONS

International Search Report and Written Opinion for corresponding PCT Appl No. PCT/EP2015/075011, dated Feb. 9, 2016.

\* cited by examiner

METHOD FOR PREDICTING AT LEAST ONE ILLUMINATION PARAMETER FOR EVALUATING AN ILLUMINATION SETTING

CROSS-REFERENCE TO RELATED APPLICATIONS

The present application is a continuation of, and claims benefit under 35 USC 120 to, international application PCT/EP2015/075011, filed Oct. 28, 2015, which claims benefit under 35 USC 119 of German Application No. DE 10 2014 223 326.7, filed Nov. 14, 2014. The entire disclosure of international application PCT/EP2012/054664 and German Application No. DE 10 2014 223 326.7 are incorporated by reference herein.

FIELD

The disclosure relates to a method for predicting at least one illumination parameter for evaluating an illumination setting for illuminating an object field of a projection exposure apparatus. The disclosure furthermore relates to a method for optimizing an illumination setting for illuminating an object field of a projection exposure apparatus.

BACKGROUND

A projection exposure apparatus which enables the illumination of an object field with a multiplicity of different illumination settings is known from e.g. DE 10 2012 220 596 A1.

SUMMARY

The present disclosure seeks to improve a method for predicting at least one illumination parameter for evaluating an object field.

In one aspect, the disclosure provides a method for predicting at least one illumination parameter for evaluating an illumination setting for illuminating an object field of a projection exposure apparatus. The method includes providing an illumination optical unit including at least one facet element for generating a plurality of illumination settings with a plurality of illumination channels. The method also includes providing a model for predicting a plurality of illumination parameters depending on the illumination setting. The method further includes calibrating the model by: providing correction terms for prediction values of a first subset of the illumination parameters; measuring actual values of the illumination parameters in the case of a number of calibration settings; determining correction terms for prediction values of a second subset of the illumination parameters taking into account the measured values; and updating the model taking into account the correction terms. In addition, the method includes predicting at least one illumination parameter of at least one illumination setting, which is not contained in the set of calibration settings, via the updated model.

A feature of the disclosure involves calibrating a model for predicting a plurality of illumination parameters, depending on the illumination settings generable by an illumination system, by providing and/or determining correction terms, wherein one subset of the correction terms is substantially constant in time and a subset of correction terms, deviating therefrom, reflects dynamic variations and is determined with the aid of a measurement on the basis of at least one calibration setting.

What was discovered according to the disclosure is that it is desirable to calibrate the model for predicting the illumination parameters. What was furthermore discovered according to the disclosure is that there are correction terms which are constant or at least substantially constant, at least for a specific period of time of up to a few days, in particular a few weeks, in particular a few months, in particular until one or more components of the illumination system are replaced. Here, these can be, in particular, correction terms for correcting geometric deviations of the illumination optical unit. In particular, the corresponding correction terms need only be determined once, in particular when putting the illumination optical unit into operation. In accordance with one aspect of the disclosure, the corresponding correction terms are established on the basis of system data of the illumination optical unit.

What was furthermore discovered according to the disclosure is that there are other correction terms which need to be re-determined regularly, in particular on a timescale of a few hours, in particular a few days. In particular, these are correction terms for correcting dynamic variations, e.g. variations in the radiation source. In this respect, what was identified is that it may be sufficient to measure a number n of calibration settings for determining these correction terms, which number, in particular, is less than the overall number of illumination settings generable by the illumination optical unit. In particular, it may be sufficient to measure merely at most 50, merely at most 10, in particular at most 5, in particular at most 3, in particular at most 2, in particular merely 1 calibration setting. The corresponding correction terms can be adopted for the remaining settings. In accordance with one aspect of the disclosure, the corresponding correction terms are established on the basis of measurements. In particular, they are established on the basis of measurements of at least one illumination pupil. In particular, intensity variations emerge from these measurements.

Therefore, the measurement time for calibrating the model can be significantly shortened by the method according to the disclosure. As a result of this, overall, the throughput of the projection exposure apparatus is increased.

In accordance with one aspect of the disclosure, the illumination parameters which are predictable by the model include intensity centroids and/or integral intensities of each pupil spot of an illumination setting. The deviations of the intensity centroids result primarily from geometric deviations of the elements of the illumination optical unit from an ideal state. These deviations are substantially constant in time.

The deviations of the integral intensities can be traced back to e.g. dynamic variations of the radiation source, in particular of the illumination radiation emitted by the radiation source, in particular in view of the intensity thereof and/or geometric variations of the same, in particular radiation direction and/or beam divergence. What was identified according to the disclosure is that intensity deviations which are dominated by the radiation source are substantially the same for different illumination settings. It is therefore sufficient to measure the corresponding correction terms on the basis of a few illumination settings, in particular on the basis of a single illumination setting. They can be assigned to other illumination settings.

In particular, the illumination parameters predictable by the model can be predicted in a manner resolved according to illumination channels, in particular according to pupil spots. Pupil spots and illumination channels are directly related to one another. The optical path from the intermediate focus via a field facet via a pupil facet to the reticle is referred to as illumination channel. The pupil spot denotes the illumination in the pupil resulting from a specific illumination channel when the illumination channel is used in a setting. In particular, these can be predicted resolved according to field points.

In accordance with a further aspect of the disclosure, a number m of calibration measurements are carried out for providing the correction terms for the first subset of illumination parameters. In particular, these calibration measurements are carried out once when the illumination optical unit is put into operation. Here, in particular, correction terms for the intensity centroids of the illumination pupil, in particular of all individual illumination channels, are determined. The corresponding correction terms can be stored in a memory of the illumination optical unit. In particular, they can be determined when putting the illumination optical unit into operation and/or when servicing the latter and are subsequently retrievable during operation of the projection exposure apparatus.

In particular, all illumination channels are taken into account when determining these correction terms; in particular, the relevant illumination settings covering all illumination channels are measured.

In accordance with a further aspect of the disclosure, the set of correction terms for the prediction values of the first subset of the illumination parameters includes correction terms for predicting intensity centroids of illumination settings. In particular, it only includes such correction terms. In particular, it does not include any correction terms for predicting intensities.

In accordance with a further aspect of the disclosure, the set of correction terms for the prediction values of the second subset of the illumination parameters includes correction terms for predicting intensities. In particular, it only includes such correction terms. In particular, it does not include any correction terms for predicting intensity centroids.

In particular, the sets of the correction terms for the prediction values of the different subsets of the illumination parameters can be without an intersection, i.e. disjoint.

In accordance with a further aspect of the disclosure, the number n of calibration settings for determining the correction terms for the prediction values of the second subset of the illumination parameters is at most equal to a number m of calibration measurements, which are performed for providing the correction terms for the prediction values of the first subset of the illumination parameters. In particular, the following applies: n≤m, in particular n/m≤0.7, in particular n/m≤0.5.

In accordance with a further aspect of the disclosure, the correction terms, in particular the correction terms for the prediction values of the first subset of the illumination parameters and/or the correction terms for the prediction values of the second subset of illumination parameters, are re-determined where desired. The re-determined correction terms, i.e. the updated correction terms, can be stored, in particular in the case of correction terms for the first subset of illumination parameters. In particular, it is possible to update the memory with the correction terms. Updating the memory can be provided at predetermined times or when a predetermined update condition occurs.

In accordance with one aspect of the disclosure, the correction terms for the prediction values of the second subset of the illumination parameters are updated more frequently than the correction terms for the prediction values of the first subset of the illumination parameters.

A further object of the disclosure consists of improving a method for optimizing an illumination setting.

This object is achieved by a method in which a model for predicting illumination parameters depending on an illumination setting is provided and calibrated in accordance with the description above and then used to predict illumination parameters which are included in a suitable evaluation function for evaluating an illumination setting. According to the disclosure, provision is made for varying illumination settings evaluated thus iteratively until a predetermined termination criterion is achieved.

Since the illumination parameters can be predicted in a substantially better and/or more reliable manner using the model calibrated according to the disclosure, this also applies to the value of the evaluation function. Consequently, the method according to the disclosure enables a more reliable optimization of an illumination setting.

BRIEF DESCRIPTION OF THE DRAWINGS

Further details and specifics of the disclosure emerge from the description of exemplary embodiments on the basis of the drawings. In detail.

DETAILED DESCRIPTION

Figure 1:
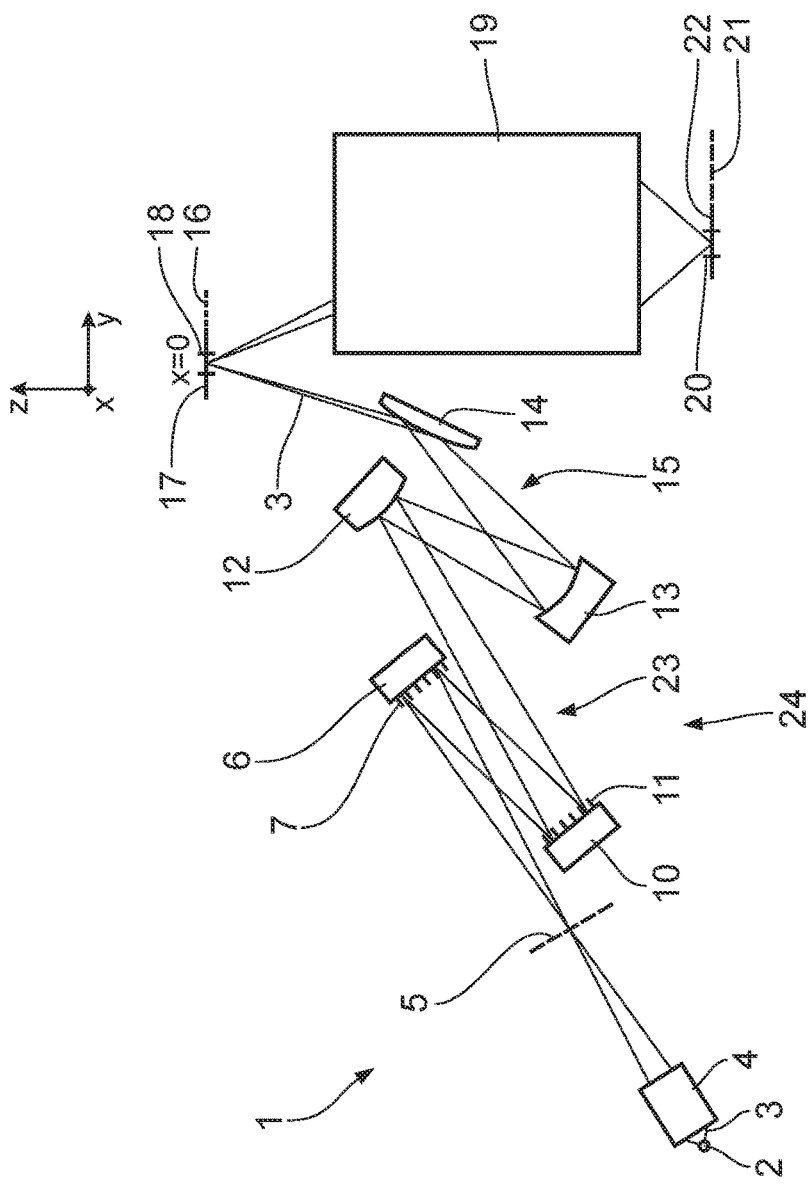
FIG. 1 shows a schematic illustration of the components of a microlithographic projection exposure apparatus, FIG. 2 schematically shows a flowchart of a method for predicting an illumination parameter for evaluating an illumination setting.

Below, the basic design of a microlithographic projection exposure apparatus 1 is first of all described in an exemplary manner. The disclosure is not restricted to the specific details of this embodiment. In particular, it can also be applied in the case of alternative embodiments of projection exposure apparatuses 1, in particular illumination optical units. The projection exposure apparatus 1 substantially corresponds to the one known from DE 10 2012 220 596 A1, which is referred to herewith. In particular, DE 10 2012 220 596 A1 is herewith integrated in its entirety into the present application as a component thereof.

A microlithographic projection exposure apparatus 1 serves to produce a microstructured or nanostructured electronic semiconductor component. A radiation source 2 emits used EUV radiation in the wavelength range of e.g. between 5 nm and 30 nm for illumination purposes. The radiation source 2 can be a GDPP (gas discharge produced plasma) source or an LPP (laser produced plasma) source. A radiation source based on a synchrotron can also be used for the radiation source 2. A person skilled in the art finds information about such a radiation source in e.g. U.S. Pat. No. 6,859,515 B2. EUV illumination light or illumination radiation 3 is used for illumination and imaging within the projection exposure apparatus 1. After the radiation source 2, the EUV illumination light 3 initially passes through a collector 4, which may be e.g. a nested collector with a multi-shell design known from the prior art or, alternatively, an ellipsoidally formed collector. A corresponding collector is known from EP 1 225 481 A2. After the collector 4, the EUV illumination light 3 initially passes through an intermediate focal plane 5, which can be used to separate unwanted radiation or particle components from the EUV illumination light 3. After passing through the intermediate focal plane 5, the EUV illumination light 3 initially impinges on a field facet mirror 6 with a multiplicity of field facets 7.

In order to simplify the description of positional relationships, a global Cartesian xyz coordinate system is respectively plotted in the drawing. In FIG. 1, the x-axis extends perpendicular to the plane of the drawing and out of the latter. In FIG. 1, the y-axis extends to the right. In FIG. 1, the z-axis extends upward.

In the region of the object plane and the image plane, the y-direction corresponds to the scanning direction of the reticle and of the wafer.

After reflection at the field facet mirror 6, the EUV illumination light 3 split into bundles of rays or partial beams which are assigned to the individual field facets 7 impinges on a pupil facet mirror 10 with a multiplicity of pupil facets 11.

The field facets 7 of the field facet mirror 6 are tiltable between a plurality of illumination tilting positions, such that a beam path of the illumination light 3 reflected by the respective field facet 7 can thereby be altered in terms of its direction and the impingement point of the reflected illumination light 3 on the pupil facet mirror 10 can thus be altered. Corresponding field facets that can be displaced between different illumination tilting positions are known from U.S. Pat. No. 6,658,084 B2 and U.S. Pat. No. 7,196,841 B2.

Each partial beam of the EUV illumination light 3 which is reflected by one of the field facets 7 is assigned at least one pupil facet 11 in such a way that a respective impinged-upon facet pair including one of the field facets 7 and one of the pupil facets 11 predefines an object field illumination channel for the associated partial beam of the EUV illumination light 3. The object field illumination channel is also denoted as illumination channel below. The channel-wise assignment of the pupil facets 11 to the field facets 7 is effected in a manner dependent on a desired illumination by the projection exposure apparatus 1. The totality of the correspondingly selected illumination channels is also referred to as illumination setting.

By way of the respective illumination tilting positions of the respective field facet 7, the disjoint set of pupil facets 11 of the pupil facet mirror 10 is assigned to this field facet 7.

Each one of the pupil facets 11 from one of these sets is impinged upon by illumination light 3 by way of exactly one of the various tilting positions of the associated field facets 7 such that, depending on the tilting position of the field facet 7, a specific illumination channel is formed between the field facet 7 and one of the pupil facets 11 of the pupil facet set. The illumination channels which can be used depending on the tilting position of exactly one of the field facets 7, that is to say by way of which the pupil facets 11 of the disjoint set of pupil facets 11 assigned to this field facet 7 can be impinged upon with the illumination light partial beam, form an illumination channel group. A field facet 7 can have more tilting positions which can be set via an actuator connected therewith than tilting positions which lead to the formation of an illumination channel. Only a tilting position which leads to the formation of an illumination channel is intended to be referred to as tilting position below.

The field facet mirror 6 has several hundred field facets 7, for example 300 field facets 7. The pupil facet mirror 10 has a number of pupil facets 11 which is at least as large as the sum of the tilting positions of all field facets 7 of the field facet mirror 6. In this case, some of the pupil facets are not used for the employed assignment of pupil facets to field facets. In particular, it is advantageous if the sum of the tilting positions of all field facets 7 of the field facet mirror 6 is equal to the number of pupil facets 11. In a variant not depicted here, the pupil facet mirror 10 is constructed as MEMS mirror array with a multiplicity of tiltable individual mirrors, wherein each one of the pupil facets 11 is formed by a plurality of such individual mirrors. Such a design of the pupil facet mirror 10 is known from US 2011/0001947 A1.

The field facets 7 are imaged in an object plane 16 of the projection exposure apparatus 1 by way of the pupil facet mirror 10 (cf. FIG. 1) and a subsequent transmission optical unit 15 consisting of three EUV mirrors 12, 13, 14. The EUV mirror 14 is configured as a mirror for grazing incidence (grazing incidence mirror). Arranged in the object plane 16 is an object in the form of reticle 17, of which an illumination region in the form of an illumination field is illuminated using the EUV illumination light 3, which illumination region coincides with an object field 18 of a projection optical unit 19 of the projection exposure apparatus 1 disposed downstream thereof. The object field illumination channels are superposed in the object field 18. The EUV illumination light 3 is reflected by the reticle 17.

The projection optical unit 19 images the object field 18 in the object plane 16 into an image field 20 in an image plane 21. Arranged in this image plane 21 is a wafer 22, which carries a light-sensitive layer which is exposed during the projection exposure using the projection exposure apparatus 1. During the projection exposure, both the reticle 17 and the wafer 22 are scanned in the y-direction in a synchronized manner. The projection exposure apparatus 1 is configured as a scanner. The scanning direction y is also referred to as object displacement direction below.

The field facet mirror 6, the pupil facet mirror 10 and the mirrors 12 to 14 of the transmission optical unit 15 are components of an illumination optical unit 23 of the projection exposure apparatus 1. In one variant of the illumination optical unit 23, which is not depicted in FIG. 1, it is also possible to partly or completely dispense with the transmission optical unit 15 such that no further EUV mirror, exactly one further EUV mirror or else exactly two further EUV mirrors may be arranged between the pupil facet mirror 10 and the object field 18. The pupil facet mirror 10 can be arranged in an entry pupil plane of the projection optical unit 19.

Together with the projection optical unit 19, the illumination optical unit 23 forms an optical system of the projection exposure apparatus 1.

The illumination optical unit 23 is a component of an illumination system 24, which moreover includes the radiation source 2.

The field facet mirror 6 constitutes a first facet mirror of the illumination optical unit 23. The field facets 7 constitute first facets of the illumination optical unit 23.

The pupil facet mirror 10 constitutes a second facet mirror of the illumination optical unit 23. The pupil facets 11 constitute second facets of the illumination optical unit 23.

A method for predicting at least one illumination parameter for evaluating an illumination setting for illuminating the object field 18, in particular the reticle 17 arranged in the object field 18, during the operation of the projection exposure apparatus 1 is described below. A model, in particular a simulation model, serves to predict the illumination parameters. The model includes design data of the projection exposure apparatus 1, in particular of the illumination optical unit 23. The model can also include further design data, in particular of the radiation source 2 and/or of the collector 4. A corresponding model is known e.g. from DE102012220596A1, to which reference is hereby made.

In particular, the model renders possible the prediction of intensity centroids $rhx^{PP}$, $rhy^{PP}$ and integral intensities $I^{PP}$ of the illumination spots in an illumination pupil. This should be understood to mean, in particular, the field point-resolved angle distribution of the illumination radiation on the reticle.

What was identified is that there may be errors in the prediction of the illumination quality (imaging performance) of the different illumination settings due to deviations of the real system from the design, i.e. from the setpoint state thereof. In particular, the illumination quality can be characterized by parameters such as uniformity, telecentricity or ellipticity of the illumination. Alternatively, it is possible to use a structure resolution achievable by the illumination when imaging the illuminated object field 18 into the image field 20 as an illumination parameter. It is also possible to use a variation of a line width of an imaged structure over the image field 20 as a parameter for evaluating an illumination setting. In respect of further details, reference is made to DE 10 2012 220 596 A1 and the prior art cited therein.

According to the disclosure, a real illumination pupil is measured. It is chopped into individual illumination spots. The energetic centroid $rhx^{Mess}$, $rhy^{Mess}$ and the total intensity $I^{Mes}$ contained therein is determined for each spot. The illumination parameters which reflect the imaging performance, such as e.g. uniformity, telecentricity or ellipticity, can be determined from these measurement data. Accordingly, the model serves to predict the illumination parameters, in particular to predict the illumination centroids of the pupil spots and the intensity contained therein, i.e. the prediction of the illumination pupil. This information serves as input of the further models, by which the imaging performance can be determined and/or predicted.

What was identified according to the disclosure is that the measured illumination pupils can be used to improve the prediction for further illumination settings. In particular, it is possible to measure a relatively small number of illumination settings, for example at most 10, in particular at most 5, in particular at most 3, in particular at most 2, in particular merely 1 illumination setting, in order thereby to improve the prediction accuracy of the model for a multiplicity of other illumination settings, in particular for all illumination settings generable by the illumination optical unit.

The model for predicting the illumination parameters serves in particular to predict the intensity centroids $rhx^{PP}_{ijk}$, $rhy^{PP}_{ijk}$ and the intensities $I^{PP}_{ijk}$, where i denotes the index of the illumination spot, in particular of the illumination spot in a specific illumination setting, in the pupil, j indexes the illumination setting and k characterizes the field point. In particular, the index i of the illumination channel runs from 1 to the number of spots in a pupil, i.e. up to 100, in particular up to 300, up to 500, up to 1000 or more; the index k of the field point runs e.g. from 1 to the number of measured field points, i.e. up to 3, in particular to 5, in particular up to 10, up to 20 or more. Other values are likewise possible.

The actual values of these parameters emerging from measurements are denoted by $rhx^{mess}_{ijk}$, $rhy^{mess}_{ijk}$ and $I^{Mess}_{ijk}$.

For the purposes of comparability of different field points and illumination settings, the overall intensities of a pupil, i.e. the overall intensities of an illumination setting, can be normalized to 1:

$$\sum_i I^{PP}_{ijk} = 1$$

$$\sum_i I^{Mess}_{ijk} = 1$$

Using this normalization, the following correction terms emerge for the intensities $I_{ijk}$ and centroids $rhx_{ijk}$, $rhy_{ijk}$, taking into consideration the overall intensities $I_{tot}$:

$$v_{ijk} = \frac{I^{Mess}_{ijk} \cdot I^{Mess}_{tot,jk}}{I^{PP}_{ijk} \cdot I^{PP}_{tot,jk}}$$

$$\Delta rhx_{ijk} = rhx^{Mess}_{ijk} - rhx^{PP}_{ijk}$$

$$\Delta rhy_{ijk} = rhy^{Mess}_{ijk} - rhy^{PP}_{ijk}$$

Here, $I^{mess}_{tot,jk}$ and $I^{PP}_{tot,jk}$ denote the overall intensities of the respective pupils prior to the normalization under the assumption that the radiation source maintains its emission characteristic during the measurements and the measurement time of each measurement is constant. In this manner, two pupils with different settings and field points become comparable to one another. If this were not the case, it would be unclear for a specific factor in the case of an intensity difference between two spots as to whether this actually is a property of the illuminator or whether the exposure times of the measurements differed by this factor.

What was identified according to the disclosure is that the number of illumination settings for establishing correction terms for each illumination channel is generally less than the overall number of all possible illumination settings. FIGS. 3A to 3G depict, in an exemplary manner, the effect of taking into account the above-described correction terms on the prediction of the intensities of individual illumination channels. In each case, the prediction value (y-axis) is plotted against the actual measured value (x-axis). The prediction values without taking into account the correction terms are denoted by circular symbols. The prediction values taking into account the aforementioned correction terms are characterized by + symbols.

Figure 3C:
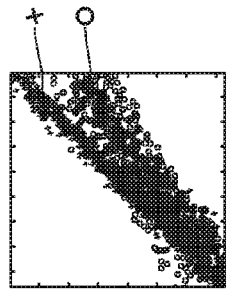
FIGS. 3A to 3G show exemplary diagrams for elucidating the correlations between measurements and radiation intensities, predicted via the model, of individual illumination channels for different illumination settings, wherein, for elucidation purposes, correlations of the non-calibrated model (open circles) and correlations of the model calibrated according to the disclosure (crosses) are depicted in each case, and FIG. 4 schematically shows a flowchart of a method for optimizing an illumination setting.
Figure 3F:
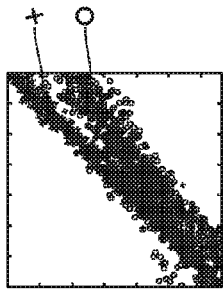
Figure 3B:
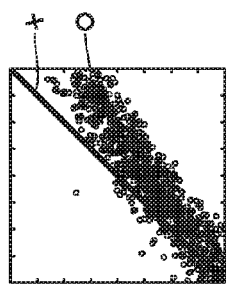
Figure 3E:
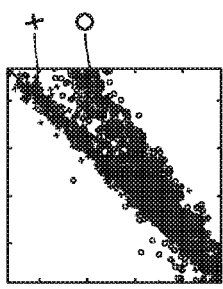
Figure 3A:
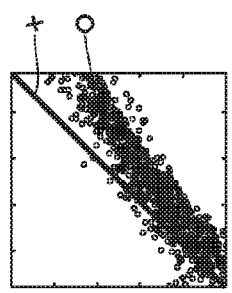
Figure 3D:
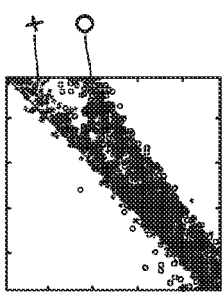
Figure 3G:
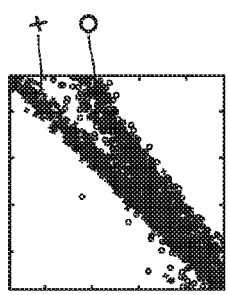

Seven different illumination settings are depicted in an exemplary manner, wherein the illumination settings depicted in FIGS. 3A and 3B were used for establishing the correction terms. The prediction of the intensities of the illumination settings depicted in FIGS. 3C to 3G was carried out taking into account the correction values established on the basis of the illumination settings underlying FIGS. 3A and 3B. As can clearly be identified qualitatively, only taking into account the correction terms leads to a clear correlation between the prediction values and the measured values.

What has emerged furthermore is that taking into account the correction terms also has a significant influence on predicting the conventional pupil parameters such as e.g. telecentricity and ellipticity.

By way of example, it was possible to improve the prediction error for the telecentricity by a factor of more than 2. In some illumination settings, the prediction error for telecentricity could also be improved by a factor of more than 3, in particular of more than 5, in particular of up to 10.

What was identified according to the disclosure is that significant measurement time can be saved when determining the correction terms. In particular, this can be traced back to the fact that a subset of the correction terms, which are denoted by $s_i$ below, is substantially constant in time. By way of example, these include the correction terms $\Delta rhx_{ijk}$ and $\Delta rhy_{ijk}$. This results primarily from geometric deviations of the illumination optical unit. It is sufficient to determine these correction terms only once, in particular when putting the illumination optical unit 23 into operation. Then, they can be stored in a memory of the illumination system. They can be updated where desired.

In particular, the correction terms $s_i$ can be established on the basis of system data of the illumination optical unit 23. In particular, they can be established on the basis of a selection of the individual part acceptance data, overall system acceptance data and calibration data described in DE 10 2012 220 596 A1.

Another subset of the correction terms, which is denoted by $f_i$ below, is traced back to dynamic variations. By way of example, these include the corrections $v_{ijk}$.

The intensity deviations $v_{ijk}$ are dominated by variations in the radiation source. What was identified is that it is therefore sufficient to establish the corresponding correction terms for a small number of illumination settings, in particular at most 10, in particular at most 5, in particular at most 3, in particular at most 2, in particular exactly 1 illumination setting. The corresponding correction terms $v_{ijk}$ can then be adopted for the remaining illumination settings. A significant amount of measurement time can be saved thereby.

In particular, the correction terms $f_i$ can be established on the basis of a selection of the online measurement data described in DE 10 2012 220 596 A1.

The concept according to the disclosure is advantageous, in particular, for illumination optical units 23 with a large number of different switching positions.

Below, the method for predicting at least one illumination parameter p* for evaluating an illumination setting is described once again in other words, with reference being made to FIG. 2.

Initially, m calibration settings $j_{Kal}$ generated by the illumination system 24 are measured in a first measurement step 31.

In a first determination step 32, the correction terms $s_i$ for the prediction values of the first subset $p_1$ of the illumination parameters p are determined. In particular, the correction terms $s_i$ are determined on the basis of the measured values from the first measurement step 31.

Then, a check is carried out in a first query 33 as to whether the correction terms $f_i$ are already determined.

If this is not the case, n≤m calibration settings $j_{Kal}$ generated by the illumination system are measured in a second measurement step 34.

The correction terms flare determined in a second determination step 35 on the basis of the measured values from this second measurement step 34.

Once both the correction terms $s_i$ and the correction terms $f_i$ are determined, it is possible to wait until a prediction of an illumination parameter becomes desirable. This is depicted in FIG. 2 as calibrated basic state 36. To the extent that what emerges in the first query 33 is that the correction terms $f_i$ are already determined, it is possible to transition immediately to the basic state 36. Initially, it is not necessary to once again carry out the second measurement step 34 and the second determination step 35.

Together, the steps 31 to 35 form a calibration part 37 for calibrating the model for predicting the illumination parameters. Advantageously, as few calibration settings $j_{Kal}$ as possible are measured in the calibration part 37. The number of calibration settings is less than 50, in particular less than 10, in particular less than 5, in particular less than 3, in particular less than 2. In particular, it is merely 1.

After calibrating the model in the calibration part 37, an illumination parameter of an illumination setting j* can be predicted in a prediction part 38. To this end, a check is initially carried out in a second query 39 as to whether the correction terms $s_i$ are still current. To the extent that this is not the case, there is a return to the first measurement step 31. To the extent that the correction terms $s_i$ are still current, a check is carried out in a third query 40 as to whether the correction terms $f_i$ are still current. To the extent that this is not the case, there is a return to the second measurement step 34.

By way of example, updating the correction terms can be triggered by measuring the radiation source to the extent that the latter shows a strong change in same. Furthermore, it is desirable to carry out an update when a component of the illumination system is exchanged. In particular, then it is desirable to update the geometric correction terms.

Whether the second query 39 is carried out can, in particular, be decided and triggered individually by the user of the system. In particular, provision can be made for starting the second query 39 only upon a user trigger.

To the extent that all correction terms $s_i$ and $f_i$ are current, it is possible to predict an illumination parameter of an illumination setting j* in a prediction step 41. Here, in particular, the current correction terms $s_i$ and $f_i$ are taken into account.

In particular, the illumination setting j* can be an illumination setting which is not contained in the set of calibration settings $j_{kal}$.

Figure 2:
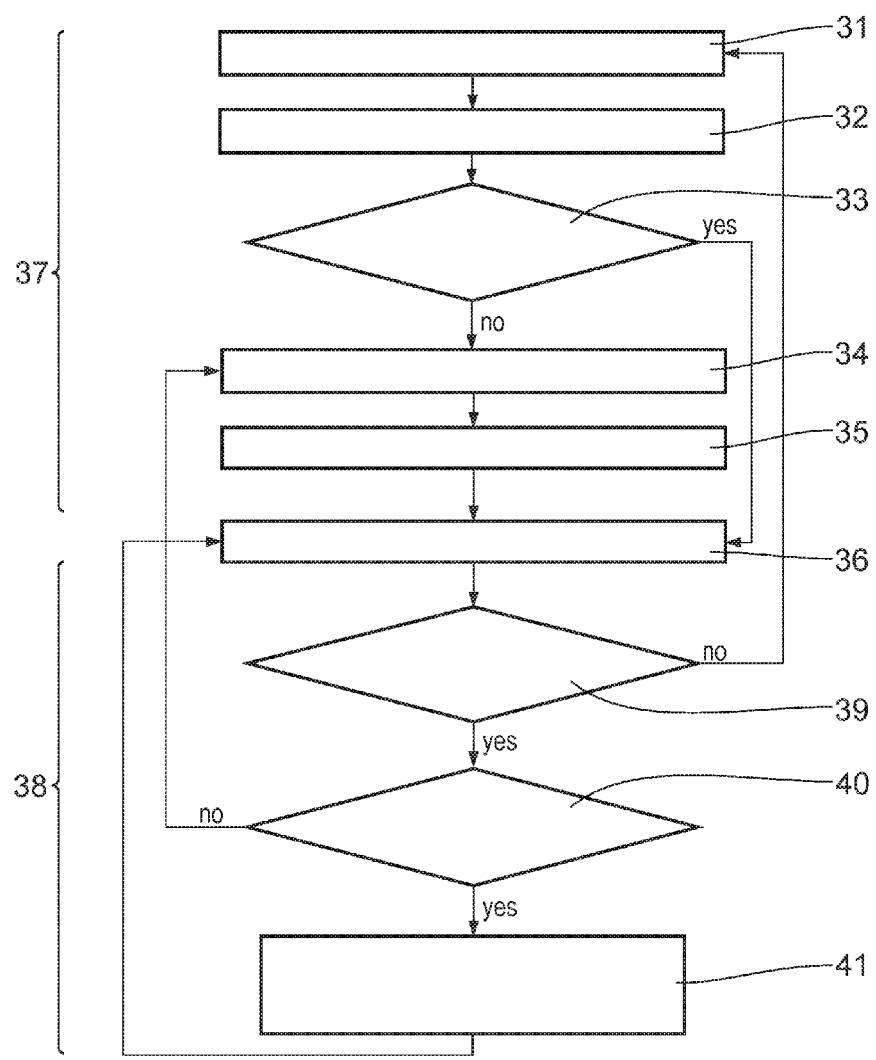

Using the method in accordance with FIG. 2 it is possible, in principle, to evaluate all illumination settings j which can be generated by the illumination system 24. On the other hand, it is only necessary to measure a relatively small number of calibration settings $j_{Kal}$ for calibrating the model in the calibration part 37. This leads to a significant saving of time. In particular, the method according to the disclosure renders it possible to use the measurement of the few illumination settings in order thereby to improve the prediction accuracy for all illumination settings.

Figure 4:
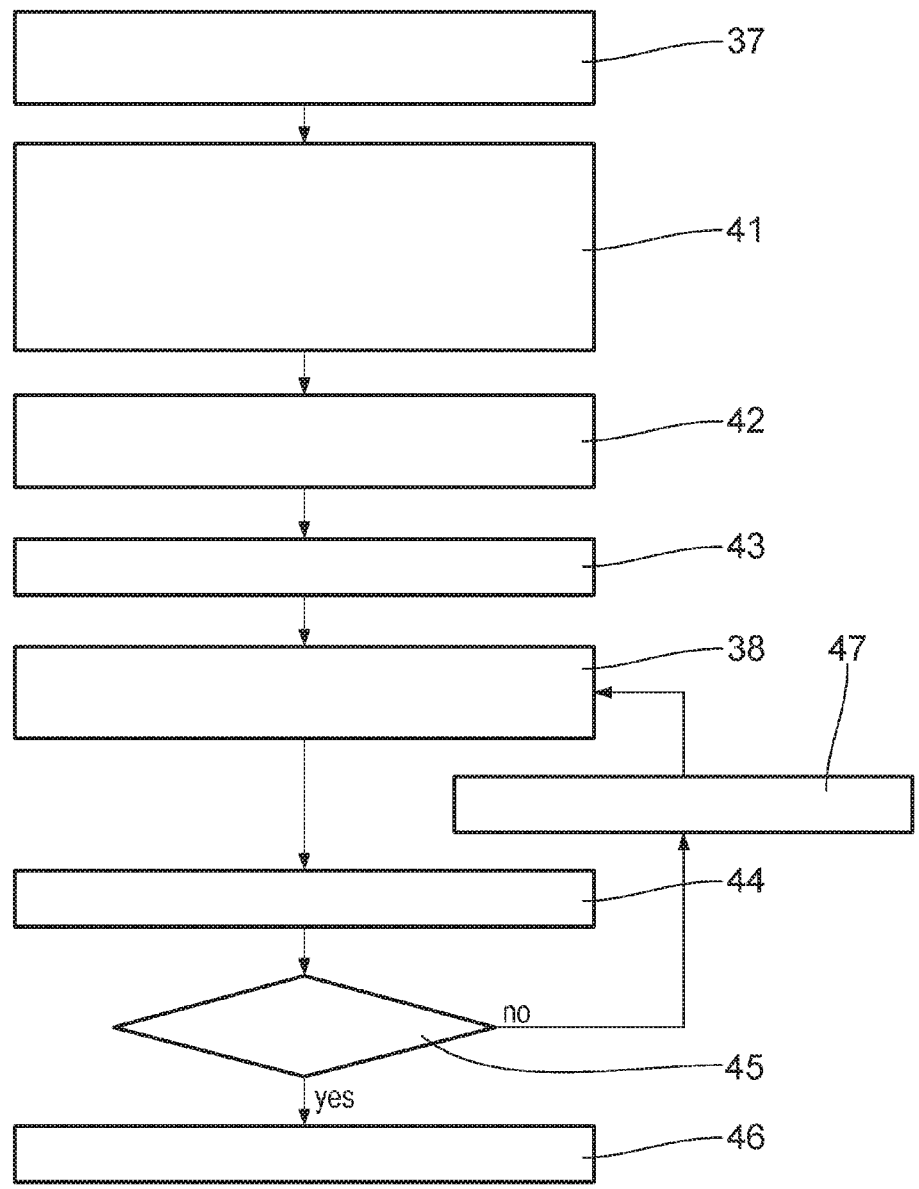

Below, a method for optimizing an illumination setting is described in note form, with reference being made to FIG. 4. Initially, a calibration of the model for predicting the parameters for evaluating the illumination settings is carried out. To this end, provision is made for a method in accordance with the calibration part 37, the description of which is hereby referred to.

Thereupon, in a first definition 41, an evaluation function is defined for evaluating an illumination setting. In particular, the evaluation function is a function of predetermined illumination parameters, in particular illumination parameters which can be predicted with the aid of the method described above.

Moreover, a termination criterion is defined in a second definition 42.

Furthermore, an illumination setting $j_{start}$ is defined as start illumination setting in a third definition 43. The start illumination setting serves as starting point for an iterative optimization of the illumination setting.

Then, the predetermined illumination parameters, which form the arguments for the evaluation function, are predicted in the prediction part 38 in accordance with the preceding description, to which reference is made hereby.

The illumination setting is evaluated in an evaluation step 44 on the basis of the predicted illumination parameters with the aid of the evaluation function defined in the first definition 41.

A check is carried out in a subsequent query 45 as to whether the termination criterion defined in the second definition 42 has been reached. To the extent that this is the case, an acceptable illumination setting was found. It can be used, in particular, to illuminate a reticle 17 arranged in the object field 18, in particular to image the reticle 17 on the wafer 22 arranged in the image field 20. This is depicted in summary in FIG. 4 as projection exposure 46.

To the extent that the termination criterion has not been reached, the switching position of at least one of the field facets 7 is varied in a variation step 47. It is also possible to vary the switching position of a plurality of field facets 7, in particular of at least two, in particular of at least three, in particular of at least four, five, six, eight or ten field facets. In principle, it is even possible to vary the switching positions of all field facets 7.

A new illumination setting emerges from varying at least one of the switching positions of the field facets 7, which new illumination setting in turn is analysed in the prediction part 38 and evaluated in the evaluation step 44. This is repeated until the predetermined termination criterion has been reached.

What is claimed is:

1. A method for predicting an illumination parameter for evaluating an illumination setting for illuminating an object field of a projection exposure apparatus, the projection exposure apparatus comprising an illumination optical unit comprising a facet element for generating a plurality of illumination settings with a plurality of illumination channels, the method comprising:
    calibrating a model for predicting a plurality of illumination parameters depending on the illumination setting by:
        providing correction terms for prediction values of a first subset of the illumination parameters;
        measuring actual values of the illumination parameters for a number of calibration settings;
        determining correction terms for prediction values of a second subset of the illumination parameters taking into account the measured actual values; and
        updating the model taking into account the correction terms; and
    using the model to predict an illumination parameter of an illumination setting which is not contained in the set of calibration settings,
    wherein at least one of the following holds:
        the illumination parameters which are predictable by the model comprise parameters selected from the group consisting of intensity centroids of an illumination setting and integral intensities of an illumination setting;
        the set of correction terms comprises correction terms for predicting intensity centroids of illumination settings;
        the set of correction terms comprises correction terms for predicting intensities; and
        the number of calibration settings for determining the correction terms is at most equal to a number of calibration settings performed to provide the correction terms.

2. The method of claim 1, further comprising establishing the correction terms on the basis of system data of the illumination optical unit.

3. The method of claim 1, further comprising establishing the correction terms on the basis of measurements.

4. The method of claim 1, wherein the illumination parameters which are predictable by the model comprise parameters selected from the group consisting of intensity centroids of an illumination setting and integral intensities of an illumination setting.

5. The method of claim 1, further comprising measuring a number of calibration settings to provide the correction terms.

6. The method of claim 1, wherein the set of correction terms comprises correction terms for predicting intensity centroids of illumination settings.

7. The method of claim 1, wherein the set of correction terms comprises correction terms for predicting intensities.

8. The method of claim 1, wherein the number of calibration settings for determining the correction terms is at most equal to a number of calibration settings performed to provide the correction terms.

9. The method of claim 1, further comprising re-determining the correction terms.

10. A method for optimizing an illumination setting for illuminating an object field of a projection exposure apparatus, the projection exposure apparatus comprising an illumination system for generating a plurality of illumination settings with a plurality of illumination channels, the method comprising:
    defining an evaluation function for evaluating an illumination setting, the evaluation function being a function of predetermined illumination parameters;
    predetermining a termination criterion for the evaluation function;
    defining an illumination setting as a start illumination setting for an iterative optimization;
    calibrating a model for predicting the illumination parameters depending on the illumination settings by:
        providing correction terms for prediction values of a subset of the illumination parameters;
        measuring actual values of the illumination parameters at a number of calibration settings;
        determining correction terms for prediction values of a subset of the illumination parameters taking into account the measured values;
        updating the model taking into account the correction terms;
    predicting the illumination parameters for establishing a functional value of the evaluation function depending on the illumination setting;
    evaluating the illumination settings via the evaluation function on the basis of the predicted illumination parameters; and
    iteratively varying of the illumination settings until the predetermined termination criterion is achieved.

11. A method of using an illumination optical unit to illuminate a field with an illumination setting, the illumination optical unit comprising a facet element for generating a plurality of illumination settings with a plurality of illumination channels, the method comprising:

calibrating a model for predicting a plurality of illumination parameters depending on the illumination setting by:
　　measuring actual values of illumination parameters for a number of calibration settings;
　　determining correction terms for prediction values of a first subset of the illumination parameters taking into account the measured actual values; and
　　updating the model taking into account correction terms for prediction values of a second subset of the illumination parameters,
wherein at least one of the following holds:
　　the illumination parameters which are predictable by the model comprise parameters selected from the group consisting of intensity centroids of an illumination setting and integral intensities of an illumination setting;
　　the set of correction terms comprises correction terms for predicting intensity centroids of illumination settings;
　　the set of correction terms comprises correction terms for predicting intensities; and
　　the number of calibration settings for determining the correction terms is at most equal to a number of calibration settings performed to provide the correction terms.

12. The method of claim 11, further comprising using the model to predict an illumination parameter of an illumination setting which is not contained in the set of calibration settings.

13. The method of claim 11, wherein the illumination optical unit is a unit of a projection exposure apparatus, and the field is an object field of the projection exposure apparatus.

14. The method of claim 11, wherein the illumination parameters which are predictable by the model comprise parameters selected from the group consisting of intensity centroids of an illumination setting and integral intensities of an illumination setting.

15. The method of claim 11, further comprising measuring a number of calibration settings to provide the correction terms.

16. The method of claim 11, wherein the set of correction terms comprises correction terms for predicting intensity centroids of illumination settings.

17. The method of claim 11, wherein the set of correction terms comprises correction terms for predicting intensities.

18. The method of claim 11, wherein the number of calibration settings for determining the correction terms is at most equal to a number of calibration settings performed to provide the correction terms.

19. The method of claim 11, further comprising re-determining the correction terms.

20. A method for evaluating an illumination setting for illuminating an object field of a projection exposure apparatus, the projection exposure apparatus comprising an illumination system for generating a plurality of illumination settings with a plurality of illumination channels, the method comprising:
　　providing correction terms for prediction values of a subset of the illumination parameters;
　　measuring actual values of the illumination parameters at a number of calibration settings;
　　determining correction terms for prediction values of a subset of the illumination parameters taking into account the measured values;
　　updating the model taking into account the correction terms;
　　predicting the illumination parameters for establishing a functional value of an evaluation function for an illumination setting depending on the illumination setting, the evaluation function being a function of predetermined illumination parameters;
　　evaluating the illumination settings via the evaluation function on the basis of the predicted illumination parameters; and
　　iteratively varying of the illumination settings until a predetermined termination criterion is achieved.

* * * * *